US010332440B2

(12) United States Patent
Lee et al.

(10) Patent No.: US 10,332,440 B2
(45) Date of Patent: Jun. 25, 2019

(54) DISPLAY DEVICE

(71) Applicant: LG DISPLAY CO., LTD., Seoul (KR)

(72) Inventors: Jongheon Lee, Paju-si (KR); Sung Jin Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/804,506

(22) Filed: Nov. 6, 2017

(65) Prior Publication Data
US 2018/0144679 A1 May 24, 2018

(30) Foreign Application Priority Data

Nov. 21, 2016 (KR) .......................... 10-2016-0155243

(51) Int. Cl.
*G09G 3/20* (2006.01)
*H01L 27/12* (2006.01)

(52) U.S. Cl.
CPC ............. *G09G 3/2092* (2013.01); *G09G 3/20* (2013.01); *H01L 27/124* (2013.01); *H01L 27/1218* (2013.01); *G09G 2300/04* (2013.01); *G09G 2300/0408* (2013.01); *G09G 2300/0426* (2013.01); *G09G 2310/0232* (2013.01); *G09G 2310/0281* (2013.01); *G09G 2310/0297* (2013.01); *G09G 2320/0209* (2013.01); *G09G 2330/04* (2013.01)

(58) Field of Classification Search
CPC ......... G09G 3/2092; G09G 2300/0408; G09G 2310/0297; G09G 2320/0209; H01L 27/1218; H01L 27/124
See application file for complete search history.

(56) References Cited

U.S. PATENT DOCUMENTS

| 5,270,693 | A | 12/1993 | Wyler et al. | |
|---|---|---|---|---|
| 9,940,866 | B2* | 4/2018 | Lin | G09G 3/20 |
| 2008/0266210 | A1* | 10/2008 | Nonaka | G09G 3/20 345/55 |
| 2010/0134743 | A1* | 6/2010 | Shin | G02F 1/13 349/143 |
| 2012/0001835 | A1* | 1/2012 | Yamamoto | G02F 1/13454 345/55 |

(Continued)

FOREIGN PATENT DOCUMENTS

| JP | 2002-14366 A | 1/2002 |
|---|---|---|
| TW | 200630725 A | 9/2006 |

*Primary Examiner* — Stephen G Sherman
(74) *Attorney, Agent, or Firm* — Seed Intellectual Property Law Group LLP

(57) ABSTRACT

A display device includes a display unit having a non-rectangular shape. A plurality of data lines and a plurality of gate lines intersect each other in the display unit. A plurality of gate in panel (GIP) circuits are arranged in a non-display region of the display device that has a shape corresponding to the shape of the display unit, and each of the GIP circuits is connected to a respective gate line. A plurality of GIP lines are connected to the GIP circuits. The GIP lines transmit respective gate control signals to the GIP circuits, and the GIP circuits apply gate signals to the gate lines based on the gate control signals. Source lines are arranged in the non-display region, and transmit respective data signals to the plurality of data lines. At least one data line is arranged parallel to the gate lines in the non-display region.

20 Claims, 7 Drawing Sheets

(56) References Cited

U.S. PATENT DOCUMENTS

| | | | | |
|---|---|---|---|---|
| 2014/0253419 A1* | 9/2014 | Tanada | ................ | G09G 3/2092 |
| | | | | 345/55 |
| 2016/0190166 A1* | 6/2016 | Kim | ..................... | H01L 27/124 |
| | | | | 257/71 |
| 2016/0240141 A1* | 8/2016 | Lee | ..................... | G02F 1/13454 |
| 2017/0322446 A1* | 11/2017 | Tae | .................. | G02F 1/133345 |

* cited by examiner

DISPLAY DEVICE

CROSS REFERENCE TO RELATED APPLICATION

This application claims priority from Korean Patent Application No. 10-2016-0155243, filed on Nov. 21, 2016, which is hereby incorporated by reference for all purposes as if fully set forth herein.

BACKGROUND

Technical Field

Embodiments disclosed herein relate to a display device, and more particularly, to a display device having a non-rectangular shape.

Description of the Related Art

As the information-oriented society continues to develop, requests for various types of display devices for displaying images have increased, and various kinds of display devices, such as a Liquid Crystal Display (LCD), a Plasma Display Panel (PDP), and an Organic Light Emitting Display (OLED), have been utilized.

In conventional display devices, display panels typically have a rectangular shape. However, in recently developed display devices, including wearable devices such as smart watches and smart glasses, display panels may have various shapes, including non-rectangular shapes.

In a typical display panel having a rectangular shape, gate lines and data lines are orthogonal to each other in the display unit, but do not intersect each other in a non-display region. However, in non-rectangular display panels, gate lines and data lines may intersect each other in a non-display region. In such display panels having gate lines and the data lines that intersect each other in the non-display region, there is a problem in that cross-talk may occur. In addition, since the length of each data line may vary depending on the shape of the display unit, deterioration in image quality may be caused by a difference in the length of the data lines. Also, when data lines and gate lines intersect each other in a non-display region, a problem may occur in that the data lines and the gate lines are short-circuited by the generation of static electricity in the non-display region in the manufacturing process.

BRIEF SUMMARY

Embodiments disclosed herein provide a display device that is capable of preventing crosstalk between a gate line and a data line.

In addition, embodiments disclosed herein provide a display device that is capable of reducing the variation of the length of a data line.

Further, embodiments disclosed herein provide a display device that is capable of preventing a gate line and a data line from being short-circuited by the generation of static electricity.

In one embodiment, the present disclosure provides a display device that includes: a display unit having a non-rectangular shape, the display unit including a plurality of data lines and a plurality of gate lines that intersect each other in the display unit; a plurality of gate in panel (GIP) circuits arranged in a non-display region of the display device that is adjacent to the display unit and has a shape corresponding to the non-rectangular shape of the display unit, each of the GIP circuits connected to a respective gate line in the non-display region; a plurality of GIP lines arranged in the non-display region and connected to the plurality of GIP circuits, the GIP lines are configured to transmit respective gate control signals to the GIP circuits, and the GIP circuits are configured to apply respective gate signals to the gate lines based on the gate control signals; and a plurality of source lines arranged in the non-display region, and configured to transmit respective data signals to the plurality of data lines. At least one data line of the plurality of data lines is arranged parallel to the gate lines in the non-display region.

In another embodiment, the present disclosure provides a display device that includes: a display unit including a plurality of data lines and a plurality of gate lines that intersect each other, the display unit having a non-rectangular shape; a gate in panel (GIP) line arranged in a non-display region of the display device, the non-display region having a shape corresponding to the shape of the display unit; a GIP circuit connected to at least one of the gate lines and to the GIP line, and configured to receive a gate control signal from the GIP line and to apply a gate signal to the at least one of the gate lines based on the received gate control signal; and a source line arranged in the non-display region, and configured to transmit a data signal to the data lines. The data lines extend in a first direction in the display unit and have a bend in the non-display region, the data lines extend from the bend in a second direction in the non-display region.

In yet another embodiment, the present disclosure provides a display device that includes: a display region having a non-rectangular outer periphery; a non-display region adjacent to the non-rectangular outer periphery of the display region; a plurality of data lines that extend in a first direction in the display region, and extend in a second direction in the non-display region, the first and second directions being transverse with respect to one another; a plurality of gate lines that extend in the second direction in the display region and in the non-display region; and a plurality of source lines in the non-display region, each of the source lines having a shape corresponding to the outer periphery of the display region, each of the data lines being coupled to a respective source line in the non-display region.

According to the embodiments disclosed herein, it is possible to prevent crosstalk between a gate line and a data line.

In addition, according to the embodiments disclosed herein, it is possible to prevent a gate line and a data line from being short-circuited by the generation of static electricity.

Further, according to the embodiments disclosed herein, it is possible to reduce the variation of the length of a data line.

BRIEF DESCRIPTION OF THE SEVERAL VIEWS OF THE DRAWINGS

The above and other objects, features and advantages of the present disclosure will be more apparent from the following detailed description taken in conjunction with the accompanying drawings, in which.

DETAILED DESCRIPTION OF THE EXEMPLARY EMBODIMENTS

Figure 1:
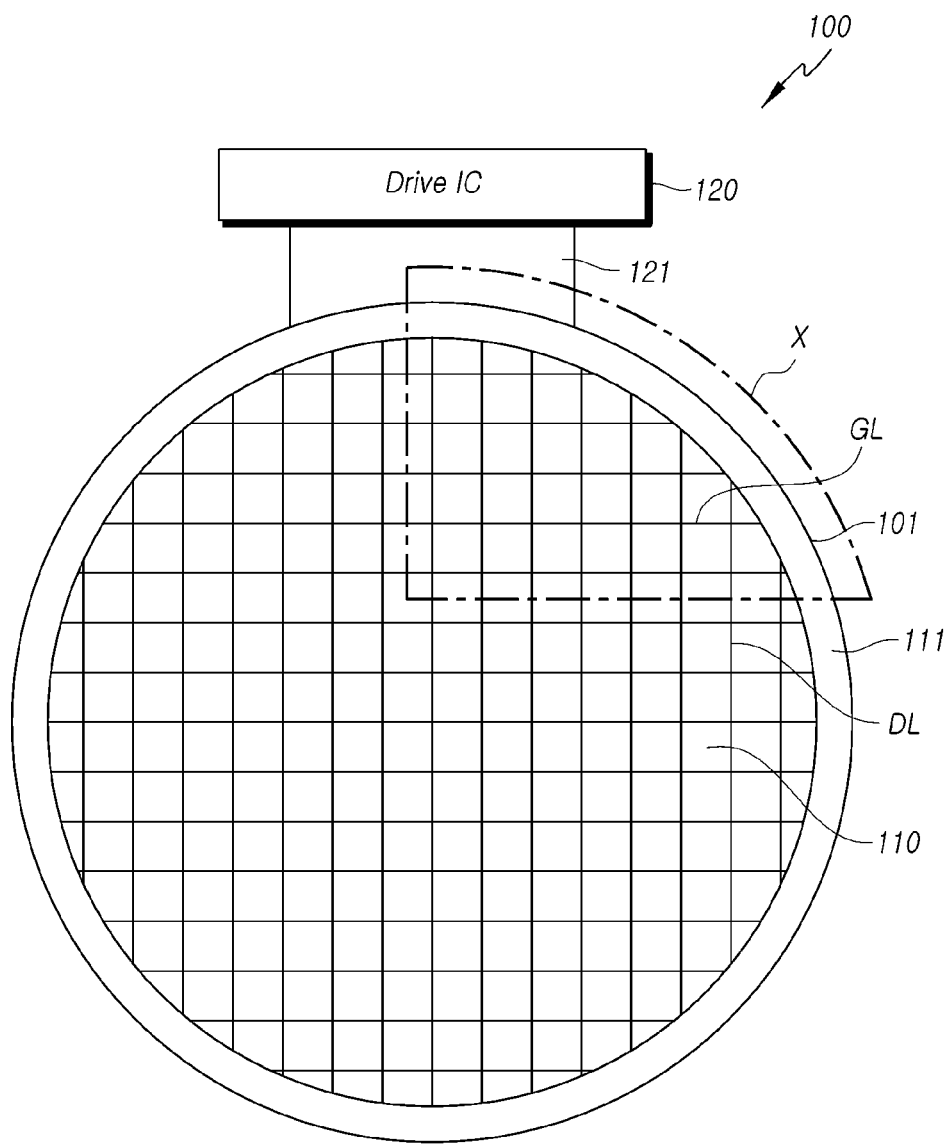
FIG. 1 is a plan view illustrating a display device according to one or more embodiments of the present disclosure.

Hereinafter, some exemplary embodiments of the present disclosure will be described in detail with reference to the accompanying illustrative drawings. In designating elements of the drawings by reference numerals, the same elements may be designated by the same reference numerals although they are shown in different drawings. Further, in the following description of the present disclosure, a detailed description of known functions and configurations incorporated herein may be omitted when inclusion of such description of known functions and configurations may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but instead is used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 is a plan view illustrating a display device according to embodiments of the present disclosure.

Referring to FIG. 1, a display device 100 may include a display unit 110 and a non-display region 111. The display unit 110 corresponds to a display region of the display device 100. The display unit 110 that has a non-regular shape and is mounted on a substrate 101, and a drive integrated circuit (IC) 120 is included in the display device 100 and drives the display unit 110. The term "non-regular shape" may mean that the display unit 110 has a non-rectangular shape. A non-regular shape may thus be a circular shape, a triangular shape, a polygonal shape, an elliptical shape, or any combination thereof.

The drive IC 120 may include a source driving circuit that supplies data signals to data lines DL in a pixel array formed in the display unit 110. One or more gate driving circuits (not illustrated) supply gate signals to the gate lines GL in the pixel array. The gate driving circuit may be formed in the non-display region 111 of the display device 100 as a gate in panel (GIP) type and may include a plurality of gate in panel driver circuits (GIP circuits). The GIP circuits drive the plurality of gate lines GL.

The display device 100 may include a display unit 110 configured to receive a driving signal on the substrate 101 and to display an image thereon, a source line (not illustrated) configured to apply a data signal to the display unit 110, a GIP circuit (not illustrated) configured to transmit a gate signal to the display unit 110, a GIP line (not illustrated) configured to transmit a gate control signal to the GIP circuit, and a non-display region 111 in which a common power line (not illustrated) configured to apply a common power to pixels (not illustrated) and the like are disposed. Further, the source line may be connected to a data line DL in the non-display region 111. The driving signal may be a data signal or a gate signal. However, embodiments of the present disclosure are not limited thereto.

In the display unit 110, a plurality of data lines DL and a plurality of gate lines GL intersect each other, and a plurality of pixels are formed in the display unit 110 with respective pixels arranged at the respective intersections of the data lines DL and gate lines GL. The display unit 110 may receive data signals and gate signals through the data lines DL and the gate lines GL, respectively, so as to display an image corresponding to the data signals in the pixels.

The non-display region 111 may be formed along the outer periphery of the display unit 110, such that the non-display region 111 is outside of the display unit 110. The non-display region 111 may correspond to the shape of the display unit 110. For example, when the display unit 110 has a circular shape, the non-display region 111 may be arranged outside the display unit 110 in a ring shape corresponding to the display unit 110. The ring shape may be called a torus shape. However, the shape of the non-display region 111 is not limited to a ring shape, and may have various shapes depending on the shape of the display unit 110. In addition, the display unit 110 may be referred to as an active region, and the non-display region 111 may be referred to as an inactive region.

The drive IC 120 may transmit a drive signal to the display unit 110. The drive signal transmitted from the drive IC 120 to the display unit 110 may be a data signal. In addition, the drive IC 120 may transmit a gate control signal to the GIP circuit. The GIP circuit may receive the gate control signal from the drive IC 120 so as to generate a gate signal, and may transmit the gate signal to the gate line GL. In addition, the drive IC 120 may be connected to the display unit 110 through a Flexible Printed Circuit Board (FPCB) 121. Here, although it is illustrated that one drive IC 120 is connected to the substrate 101, embodiments of the present disclosure are not limited thereto. In addition, the drive IC 120 may be a Chip On Film (COF) that may be mounted on the FPCB 121.

In addition, among the plurality of data lines DL, at least one data line may be disposed in the non-display region 111 and extending in a direction parallel to the gate lines GL, and may be connected to the source line. The data lines DL may be disposed parallel to the gate lines GL in the non-display region 111, so that the data lines DL do not intersect the gate lines GL in the non-display region 111. Thus, it is possible to suppress the occurrence of crosstalk due to the intersection of the data lines DL and the gate lines GL in the non-display region 111. In addition, since the data lines DL and the gate lines GL do not intersect in the non-display region, it is possible to prevent shorts, which may be caused by the generation of static electricity, from occurring in the non-display region.

Further, the non-display region 111 corresponds to the shape of the display unit 110, and the source line may be disposed to correspond to the shape of the non-display region 111. That is, the non-display region 111 has the same shape as the outer periphery of the display unit 110, which may be circular as shown in FIG. 1. However, the present disclosure is not limited thereto. A plurality of GIP lines may be arranged parallel to each other regardless of the shape of the display unit 110. However, when the display unit 110 has a non-regular shape, a plurality of source lines are arranged according to the shape of the non-display region 111, and as a result, the plurality of GIP lines and the plurality of source lines may be arranged so as not to be orthogonal to each other in the non-display region 111. In addition, the data lines DL connected to the source lines may have a portion that is parallel to the gate lines GL in the non-display region 111.

Figure 2:
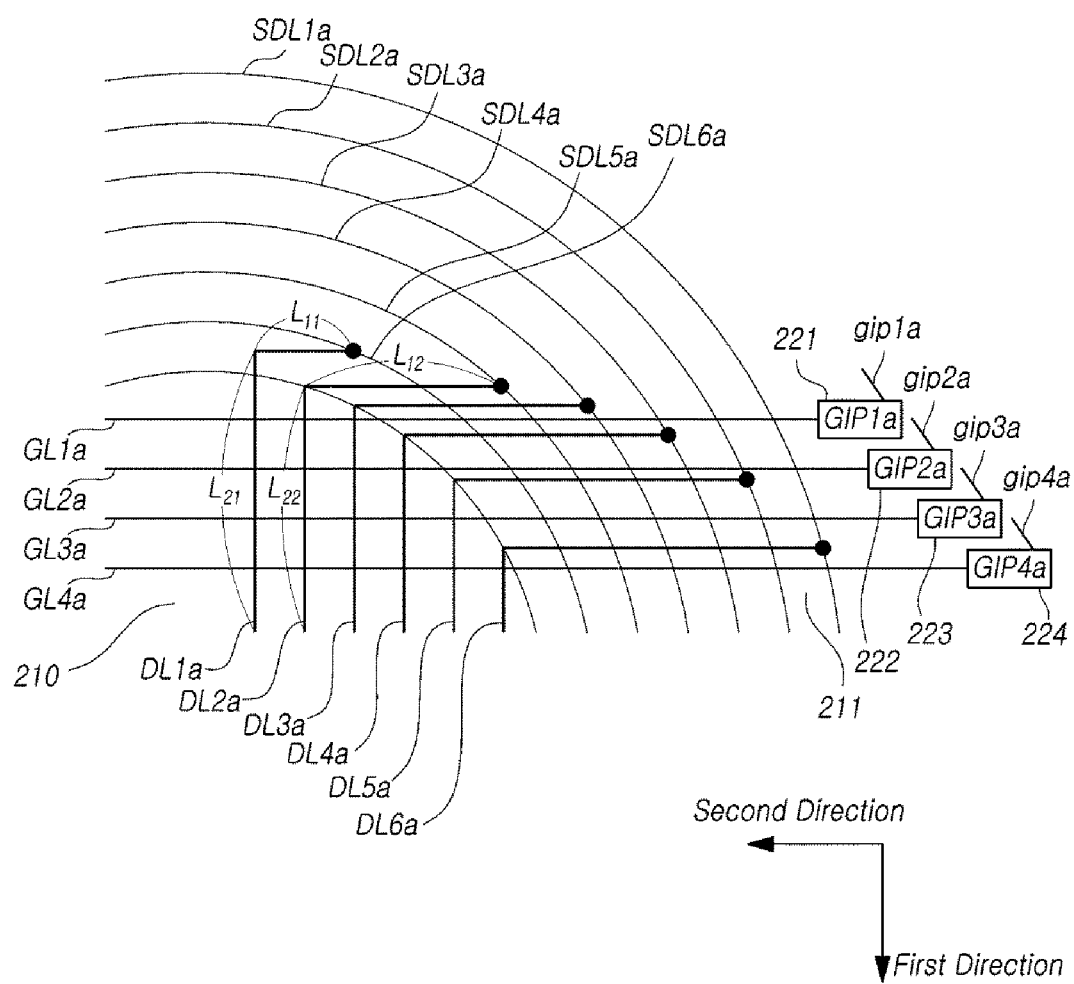
FIG. 2 is a schematic diagram illustrating a wiring connection relationship in a region X of the display device illustrated in FIG. 1, in accordance with one or more embodiments.

FIG. 2 is a schematic diagram illustrating a wiring connection relationship in the region X of the display device illustrated in FIG. 1.

Referring to FIG. 2, a plurality of data lines DL1a, DL2a, DL3a, DL4a, DL5a, and DL6a may be arranged extending in a first direction within the circular display unit 210, and extending in a second direction in a non-display region 211 outside the outer periphery of the circular display unit 210. In the non-display region 211, the data lines DL1a, DL2a, DL3a, DL4a, DL5a, and DL6a may be connected to a plurality of source lines SDL1a, SDL2a, SDL3a, SDL4a, SDL5a, and SDL6a, which are arranged in a ring shape. The plurality of data lines DL1a, DL2a, DL3a, DL4a, DL5a, and DL6a may be bent in a portion adjacent to the display unit 210, such that a first portion of each of the data lines extends in the first direction within the display unit 210, and a second portion of each of the data lines extends in the second direction in the non-display region 211. A plurality of gate lines GL1a, GL2a, GL3a, and GL4a may be arranged in the second direction to intersect the plurality of data lines DL1a, DL2a, DL3a, DL4a, DL5a, and DL6a within the display unit 210. The first and second directions may be perpendicular to each other, as shown.

Among the plurality of data lines DL1a, DL2a, DL3a, DL4a, DL5a, and DL6a, the first data line DL1a may be connected to the sixth source line SDL6a, which is arranged in the innermost position of the plurality of source lines SDL1a, SDL2a, SDL3a, SDL4a, SDL5a, and SDL6a and is nearest to the display unit 110. In this case, the first data line DL1a may be bent in the non-display region 211 from the second direction to the first direction, and extends along the first direction in the display unit 210. The second data line DL2a may be connected to the fifth source line SDL5a, which is adjacent to the sixth source line SDL6a and is the second nearest source line to the display unit 110. The second data line DL2a may be bent in the non-display region 211 from the second direction to the first direction to be arranged in the display unit 210.

The third data line DL3a may be connected to the fourth source line SDL4a, which is adjacent to the fifth source line SDL5a. The third data line DL3a may be bent in the non-display region 211 from the second direction to the first direction to be arranged in the display unit 210. The fourth data line DL4a may be connected to the third source line SDL3a, which is adjacent to the fourth source line SDL4a. The fourth data line DL4a may be bent in the non-display region 211 from the second direction to the first direction to be arranged in the display unit 210. The fifth data line DL5a may be connected to the second source line SDL2a, which is adjacent to the third source line SDL3a. The fifth data line DL5a may be bent in the non-display region 211 from the second direction to the first direction to be arranged in the display unit 210. The sixth data line DL6a may be connected to the first source line SDL1a, which is adjacent to the second source line SDL2a and may be the source line that is farthest from the display unit 210. The sixth data line DL6a may be bent in the non-display region 211 from the second direction to the first direction to be arranged in the display unit 210.

The first gate line GL1a may be connected to the first GIP circuit 221, the second gate line GL2a may be connected to the second GIP circuit 222, the third gate line GL3a may be connected to the third GIP circuit 223, and the fourth gate line GL4a may be connected to the fourth GIP circuit 224. Each of the GIP circuits 221, 222, 223, and 224 may be connected to a respective one of the GIP lines gip1a, gip2a, gip3a and gip4a so as to receive a gate control signal, e.g., from the drive IC 120. Each of the GIP circuits 221, 222, 223, and 224 may generate a gate signal corresponding to the received gate control signal, and may transmit the gate signal to the corresponding one of the lines GL1a, GL2a, GL3a, and GL4a. Here, each of the GIP lines gip1a, gip2a, gip3a, and gip4a is illustrated, by a diagonal line, as being connected to one of the GIP circuits 221, 222, 223, and 224, but is not limited thereto. The respective GIP circuits 221, 222, 223, and 224 may sequentially output gate signals.

In addition, the portion of the fourth data line DL4a arranged in the non-display region 211 extending in the second direction may be positioned between the first gate line GL1a and the second gate line GL2a. The portion of the fifth data line DL5a extending in the second direction may be positioned between the second gate line GL2a and the third gate line GL3a, and the portion of the sixth data line DL6a extending in the second direction may be positioned between the third gate line GL3a and the fourth gate line GL4a.

The first to third data lines DL1a to DL3a may intersect all the gate lines GL1a, GL2a, GL3a, and GL4a in the display unit 210. In addition, the fourth data line DL4a may intersect the second to fourth gate lines GL2a to GL4a in the display unit 210, but may not intersect the first gate line GL1a in the non-display region 211. The fifth data line DL5a may intersect the third and fourth gate lines GL3a and GL4a in the display unit 210, but may not intersect the first and second gate lines GL1a and GL2a in the non-display region 211. Further, the sixth data line GL6a may intersect the fourth gate line GL4a in the display unit 210, but may not intersect the first to third gate lines GL1a to GL3a in the non-display region 211.

Therefore, the data lines DL1a, DL2a, DL3a, DL4a, DL5a, and DL6a do not intersect the gate lines GL1a, GL2a, GL3a, and GL4a in the non-display area 211, so that it is possible to suppress the occurrence of crosstalk, which may occur when the data lines DL1a, DL2a, DL3a, DL4a, DL5a, and DL6a and the gate lines GL1a, GL2a, GL3a, and GL4a intersect each other in the non-display region 211. In addition, it is possible to prevent the occurrence of a short due to static electricity between the data lines DL1a, DL2a, DL3a, DL4a, DL5a, and DL6a and the gate lines GL1a, GL2a, GL3a, and GL4a in the non-display region 211.

As shown in FIG. 2, the first data line DL1a may be the data line that passes through the nearest location from the center of the circular display unit 210, and the second data line DL2a may be the data line that passes through the next nearest location from the center of the circular display unit 210. In addition, the sixth data line DL6a may be the data line that passes through the farthest location from the center of the circular display unit 210. Therefore, the length $L_{21}$ of the first data line DL1a, which is arranged in the first direction, may be longer than the length $L_{22}$ of the second data line DL2a, which is arranged in the first direction. Conversely, the length $L_{11}$ of the first data line DL1a which arranged in the second direction may be shorter than the length $L_{12}$ of the second data line DL2a, which is arranged in the second direction. In addition, while the length of the sixth data line DL6a in the first direction may be shorter than the lengths of other data lines in the first direction, the length the sixth data line DL6a in the second direction may be longer than the lengths of the other data lines in the second direction. Accordingly, when the length of a data line is relatively long in the display unit 210, the length of the data line may be relatively short in the non-display region 211, and the when the length of a data line is relatively short in the display unit 210, the length of the data line may be relatively long in the non-display region 211.

Due to this reason, the variation in the length of the data lines DL1a, DL2a, DL3a, DL4a, DL5a, and DL6a connected to the source lines SDL1a, SDL2a, SDL3a, SDL4a, SDL5a, and SDL6a can be reduced in the display device. In addition, the lengths of the respective data lines DL1a, DL2a, DL3a, DL4a, DL5a, and DL6a may be designed to be equal to each other. Therefore, when manufacturing the display device, it is not necessary to perform design to compensate for the length differences of the data lines DL1a, DL2a, DL3a, DL4a, DL5a, and DL6a. However, the present disclosure is not limited thereto.

Figure 3:
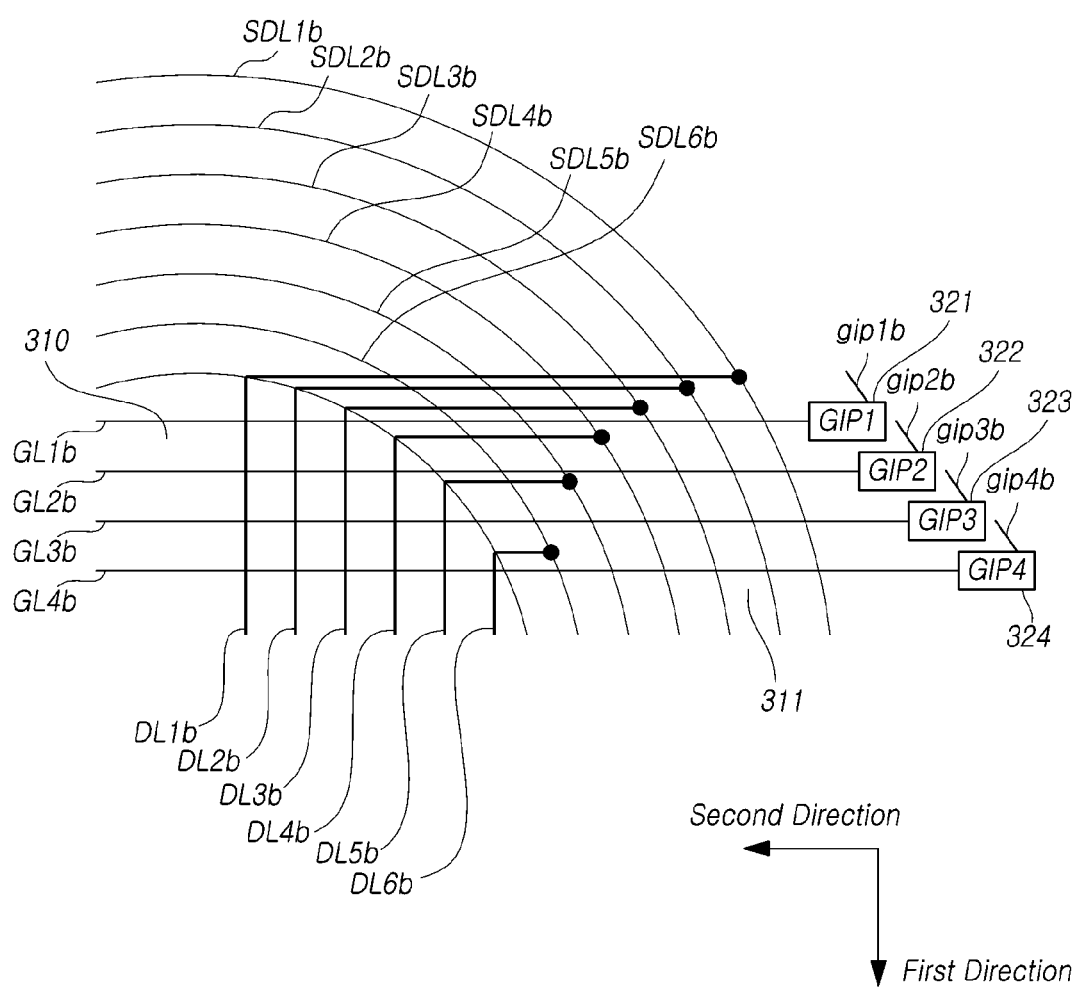
FIG. 3 is a schematic diagram illustrating an alternative wiring connection relationship in the region X of the display device illustrated in FIG. 1, in accordance with one or more embodiments.

FIG. 3 is a schematic diagram illustrating another wiring connection relationship in the region X of the display device illustrated in FIG. 1, in accordance with one or more embodiments.

Referring to FIG. 3, a plurality of data lines DL1b, DL2b, DL3b, DL4b, DL5b, and DL6b may be arranged extending in a first direction within the circular display unit 210, and extending in a second direction in a non-display region 311 outside the outer periphery of the circular display unit 310. In the non-display region 311, the data lines DL1b, DL2b, DL3b, DL4b, DL5b, and DL6b may be connected to a plurality of source lines SDL1b, SDL2b, SDL3b, SDL4b, SDL5b, and SDL6b, which are arranged in a ring shape. The plurality of data lines DL1b, DL2b, DL3b, DL4b, DL5b, and DL6b may be bent in a portion adjacent to the display unit 310, such that a first portion of each of the data lines extends in the first direction within the display unit 310, and a second portion of each of the data lines extends in the second direction in the non-display region 311. A plurality of gate lines GL1b, GL2b, GL3b, and GL4b may be arranged in the second direction to intersect the plurality of data lines DL1b, DL2b, DL3b, DL4b, DL5b, and DL6b within the display unit 310.

Within the circular display unit 310, the plurality of data lines DL1b, DL2b, DL3b, DL4b, DL5b, and DL6b may be arranged in the first direction, and the plurality of gate lines GL1b, GL2b, GL3b, and GL4b may be arranged in the second direction. Therefore, the plurality of data lines DL1b, DL2b, DL3b, DL4b, DL5b, and DL6b, and the plurality of gate lines GL1b, GL2b, GL3b and GL4b may intersect each other within the display unit 310. In addition, the plurality of source lines SDL1b, SDL2b, SDL3b, SDL4b, SDL5b, and SDL6b may be arranged outside the outer periphery of the display unit 310 in a ring shape.

Among the plurality of data lines DL1b, DL2b, DL3b, DL4b, DL5b, and DL6b, the first data line DL1b may be connected to the first source line SDL1b, which is arranged in the outermost position among the plurality of source lines SDL1b, SDL2b, SDL3b, SDL4b, SDL5b, and SDL6b. The second data line DL2b may be connected to the second source line SDL2b, which is adjacent to the first source line SDL1b. The third data line DL3b may be connected to the third source line SDL3b adjacent to the second source line SDL2b. The third data line DL3b may be bent in the non-display region from the second direction to the first direction, and extends along the first direction in the display unit 310.

The fourth data line DL4b may be connected to the fourth source line SDL4b adjacent to the third source line SDL3b. The fourth data line DL4b may be bent in the non-display region 311 from the second direction to the first direction so as to be arranged in the display unit 310. The fifth data line DL5b may be connected to the fifth source line SDL5b adjacent to the fourth source line SDL4b. The fifth data line DL5b may be bent in the non-display region 311 from the second direction to the first direction so as to be arranged in the display unit 310. The sixth data line DL6b may be connected to the sixth source line SDL6b adjacent to the fifth source line SDL5b. The sixth data line DL6b may be bent in the non-display region 311 from the second direction to the first direction so as to be arranged in the display unit 310.

In this case, the first gate line GL1b may be connected to the first GIP circuit 321, the second gate line GL2b may be connected to the second GIP circuit 322, the third gate line GL3b may be connected to the third GIP circuit 323, and the fourth gate line GL4b may be connected to the fourth GIP circuit 324. Each of the GIP circuits 321, 322, 323, and 324 may be connected to a respective one of the GIP lines gip1b, gip2b, gip3b, and gip4b so that a gate control signal is transmitted to each of the GIP circuits 321, 322, 323, and 324, and each of the GIP circuits 321, 322, 323, and 324 may generate a gate signal corresponding to the received gate control signal, and may transmit the gate signal to the corresponding one of the gate lines GL1b, GL2b, GL3b, and GL4b. Here, each of the GIP lines gip1b, gip2b, gip3b, and gip4b is illustrated, by a diagonal line, as being connected to one of the GIP circuits 321, 322, 323, and 324, but is not limited thereto. The respective GIP circuits 321, 322, 323, and 324 may sequentially output gate signals.

In addition, the portion of the fourth data line DL4b arranged in the non-display region 311 extending in the second direction may be positioned between the first gate line GL1b and the second gate line GL2b. The portion of the fifth data line DL5b extending in the second direction may be positioned between the second gate line GL2b and the third gate line GL3b, and the portion of the sixth data line DL6b extending in the second direction may be positioned between the third gate line GL3b and the fourth gate line GL4b. However, the present disclosure is not limited thereto.

The first to third data lines DL1b to DL3b may intersect all the gate lines GL1b, GL2b, GL3b, and GL4b in the display unit 310. In addition, the fourth data line DL4b may intersect the second to fourth gate lines GL2b to GL4b in the display unit 310, but may not intersect the first gate line GL1b in the non-display region 311. The fifth data line DL5b may intersect the third and fourth gate lines GL3b and GL4b in the display unit 310, but may not intersect the first and second gate lines GL1b and GL2b in the non-display region 311. Further, the sixth data line DL6b may intersect the fourth gate line GL4b in the display unit 310, but may not intersect the first to third gate lines GL1b to GL3b in the non-display region 311.

Therefore, the data lines DL1b, DL2b, DL3b, DL4b, DL5b, and DL6b do not intersect the gate lines GL1b, GL2b, GL3b, and GL4b in the non-display region 311, so that it is possible to suppress the occurrence of crosstalk, which may occur when the data lines DL1b, DL2b, DL3b, DL4b, DL5b, and DL6b and the gate lines GL1b, GL2b, GL3b, and GL4b intersect each other. In addition, it is possible to prevent the occurrence of shorts by static electricity between the data lines DL1b, DL2b, DL3b, DL4b, DL5b, and DL6b and the gate lines GL1b, GL2b, GL3b, and GL4b in the non-display region 311.

Figure 4:
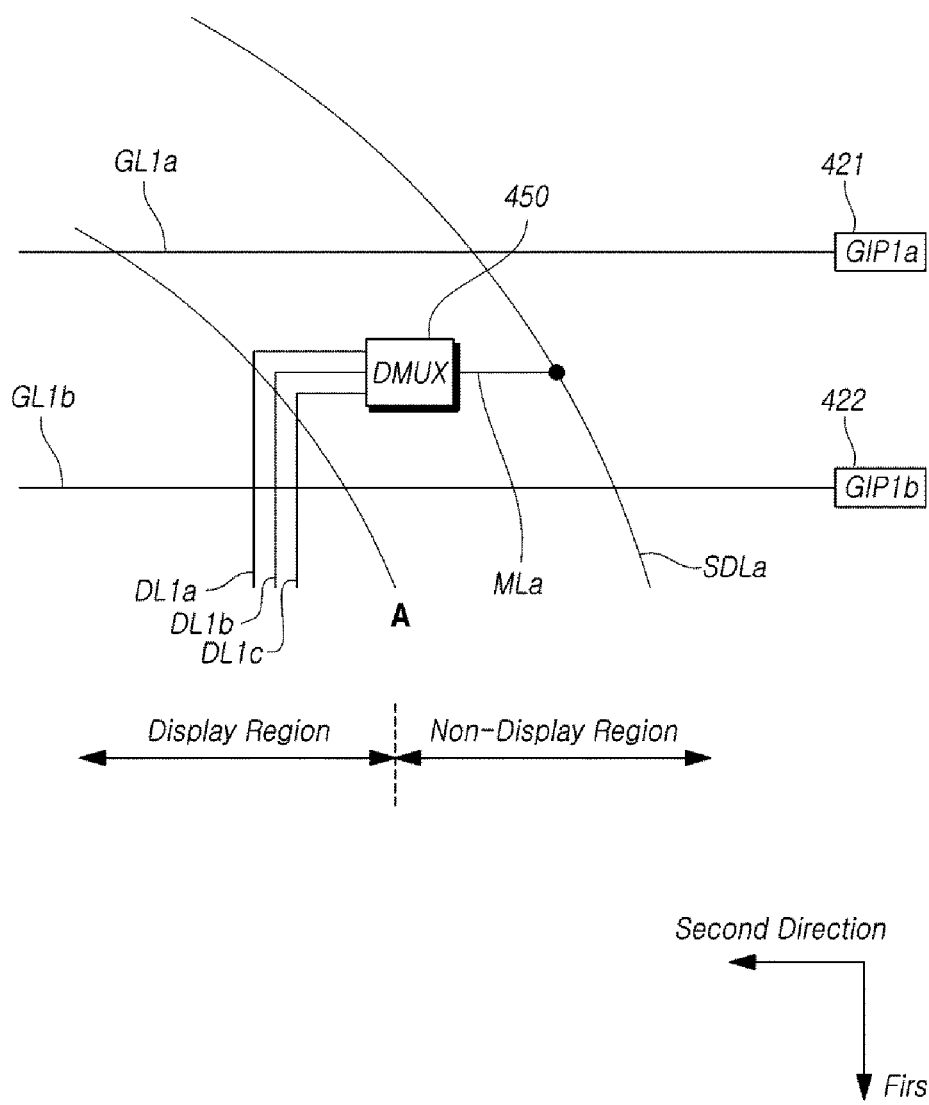
FIG. 4 is a schematic diagram illustrating a multiplexer (MUX) connected to data lines in the display device illustrated in FIG. 1, in accordance with one or more embodiments.

FIG. 4 is a schematic diagram illustrating a demultiplexer (DMUX) connected to data lines in the display device illustrated in FIG. 1, in accordance with embodiments of the present disclosure.

Referring to FIG. 4, in a non-display region, at least two data lines of a plurality of data lines may be connected to at least one source line of a plurality of source lines through a DMUX.

More specifically, a first gate line GL1a and a second gate line GL1b may be arranged parallel to each other with a predetermined gap or distance between the first and second gate lines GL1a, GL1b in the first direction. The first gate line GL1a and the second gate line GL1b may be connected to a first GIP circuit 421 and a second GIP circuit 422, respectively. The first GIP circuit 421 and the second GIP circuit 422 may receive gate control signals from respective GIP lines (not shown), and may sequentially output gate signals, respectively. A DMUX 450 may be disposed between the first gate line GL1a and the second gate line GL1b in the non-display region. In addition, a source line SDLa and the DMUX 450 may be connected to each other through a DMUX line MLa. One DMUX 450 may be connected to three data lines DL1a, DL1b, and DL1c. Therefore, a data signal transmitted through one source line SDLa may be selectively transmitted to any of the three data lines DL1a, DL1b, and DL1c by the DMUX 450. However, this example is illustrative, and in various embodiments two data lines may be connected to the DMUX 450 or three data lines may be connected to the DMUX 450.

In addition, since three data lines DL1a, DL1b, and DL1c are connected to one DMUX 450, which is connected to the source line SDLa, it is possible to reduce the number of channels that output a data voltage from a drive IC (not illustrated) connected to the source line SDLa. In addition, when the number of channels of the drive IC is reduced, the number of source lines may also be reduced, so that the area of the non-display region can be reduced.

Further, the three data lines DL1a, DL1b, and DL1c may be arranged extending in the second direction from the DMUX 450, and may be bent to extend in the first direction at or near a boundary A adjacent to the display unit. The portions of the three data lines DL1a, DL1b, and DL1c extending in the first direction may intersect the second gate line GL1b within the display unit. The portions of the three data lines DL1a, DL1b, and DL1c extending in the first direction do not intersect the first gate line GL1a in the display unit, as shown in FIG. 4.

Figure 5:
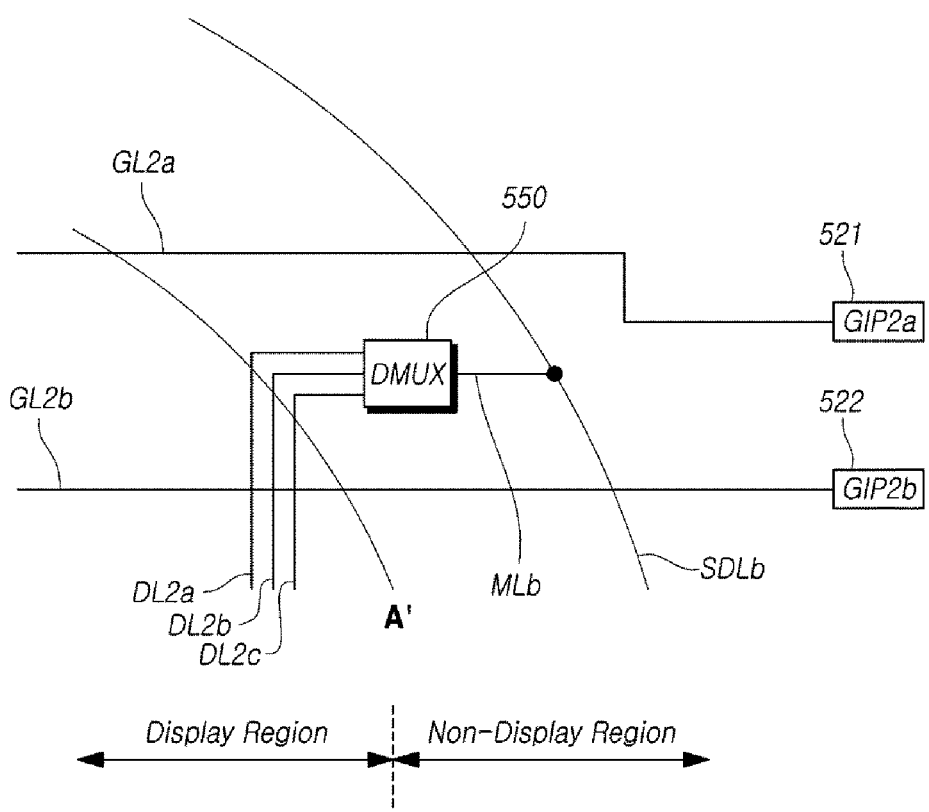
FIG. 5 is a schematic diagram illustrating the MUX connected to data lines, and an alternative arrangement of the gate lines in the display device illustrated in FIG. 1, in accordance with one or more embodiments.

FIG. 5 is a schematic diagram illustrating a DMUX connected to data lines in the display device illustrated in FIG. 1, in accordance with embodiments of the present disclosure.

Referring to FIG. 5, in a non-display region, at least two data lines of a plurality of data lines may be connected to at least one source line of a plurality of source lines through one DMUX.

More specifically, the first gate line GL2a and the second gate line GL2b may be connected to a first GIP circuit 521 and a second GIP circuit 522, respectively. The first GIP circuit 521 and the second GIP circuit 522 may receive gate control signals, and may sequentially output gate signals, respectively. One or both of the first gate line GL2a and the second gate line GL2b may be bent twice, and may then be arranged parallel to each other with a predetermined gap or distance therebetween. For example, as shown in FIG. 5, the first gate line GL2a may have a first length that extends in the second direction, a second length that extends in the first direction between a first bend and a second bend, and a third length that extends in the second direction from the second bend to the first GIP circuit 521. Thus, even when the space in which the first GIP circuit 521 and the second GIP circuit 522 are arranged is small, the first GIP circuit 521 and the second GIP circuit 522 may be arranged in a non-display region with an interval narrower than the interval of the gate lines.

A DMUX 550 may be disposed between the first gate line GL2a and the second gate line GL2b in the non-display region. In addition, a source line SDLb and the DMUX 550 may be connected to each other through a DMUX line MLb. One DMUX 550 may be connected to three data lines DL2a, DL2b, and DL2c. Therefore, a data signal transmitted through one source line SDLb may be selectively transmitted to any of the three data lines DL2a, DL2b, and DL2c by the DMUX 550. However, this is illustrative, and two data lines may be connected to the DMUX 550 or three data lines may be connected to the DMUX 550.

Further, the three data lines DL2a, DL2b, and DL2c may be arranged extending in the second direction from the DMUX 550, and may be bent to extend in the first direction at or near a boundary A' adjacent to the display unit. The portions of the three data lines DL2a, DL2b, and DL2c extending in the first direction may intersect the second gate line GL2b within the display unit. The portions of the three data lines DL2a, DL2b, and DL2c extending in the first direction do not intersect the first gate line GL2a in the display unit, as shown in FIG. 5.

Figure 6:
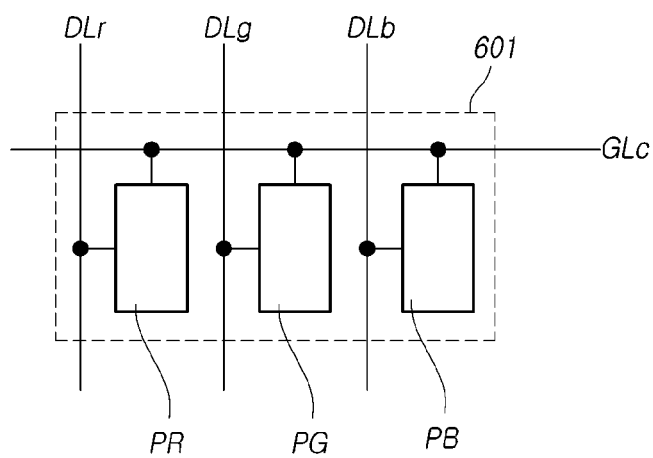
FIG. 6 is a schematic diagram illustrating an embodiment of pixels employed in the display device illustrated in FIG. 1.

FIG. 6 is a schematic diagram illustrating an embodiment of pixels employed in the display device illustrated in FIG. 1.

Referring to FIG. 6, a pixel 601 may include three sub-pixels PR, PG, and PB. The sub-pixels may be a red sub-pixel PR, a green sub-pixel PG, and a blue sub-pixel PB, respectively. However, the present disclosure is not limited thereto. Each of the sub-pixels PR, PG, and PB may receive a gate signal through the same gate line GLc. Further, the red sub-pixel PR may be connected to a red data line DLr, the green sub-pixel PG may be connected to a green data line DLg, and the blue sub-pixel PB may be connected to a blue data line DLb. The red data line DLr, the green data line DLg, and the blue data line DLb may be three data lines connected to the DMUX illustrated in FIG. 4 or FIG. 5. Accordingly, data voltages on the source line may be selectively output by a DMUX to any of the three sub-pixels. Here, although the pixel is illustrated as including three sub-pixels, it is merely illustrative, and the present disclosure is not limited thereto.

Figure 7:
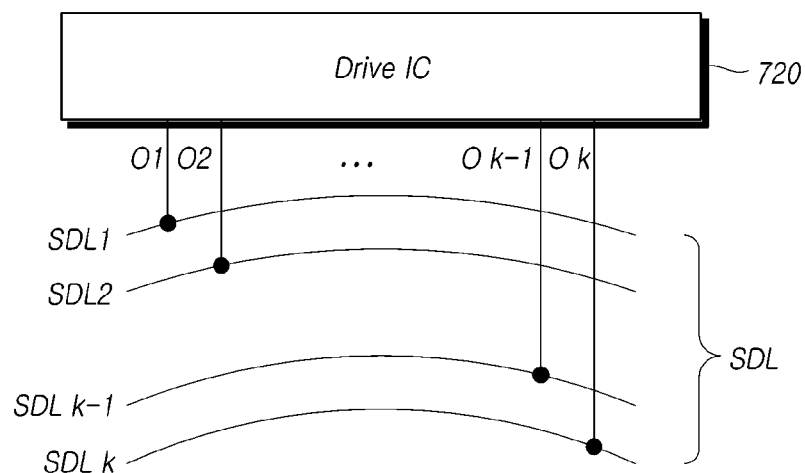
FIG. 7 is a schematic diagram illustrating an embodiment of a connection relationship between a drive IC and source lines.

FIG. 7 is a schematic diagram illustrating an embodiment of a connection relationship between a drive IC and source lines.

Referring to FIG. 7, a drive IC 720 may include a plurality of output lines O1, O2, ..., Ok-1, and Ok. The respective output lines may output voltages corresponding to data signals in parallel. Further, a plurality of output lines may be connected to a plurality of source lines SDL1, SDL2, ... SDLk-1, and SDLk, respectively. Accordingly, the plurality of source lines SDL1, SDL2, ... SDLk-1, and SDLk may receive voltages corresponding to the data signals output in parallel from the drive IC 720.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiments explicitly described herein. The scope of the present disclosure shall be construed on the basis of the accompanying claims in such a manner that all of the technical ideas included within the scope equivalent to the claims belong to the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
a display unit having a non-rectangular shape, the display unit including a plurality of data lines and a plurality of gate lines, the plurality of data lines and the plurality of gate lines extending in directions that intersect each other in the display unit;
a plurality of gate in panel (GIP) circuits arranged in a non-display region of the display device, the non-display region being adjacent to the display unit and having a shape corresponding to the non-rectangular shape of the display unit, each of the GIP circuits connected to a respective gate line in the non-display region;
a plurality of GIP lines arranged in the non-display region and connected to the plurality of GIP circuits, the GIP lines are configured to transmit respective gate control signals to the GIP circuits, and the GIP circuits are configured to apply respective gate signals to the gate lines based on the gate control signals; and
a plurality of source lines arranged in the non-display region, and configured to transmit respective data signals to the plurality of data lines,
wherein at least one data line of the plurality of data lines includes a first portion and a second portion, the first portion extending toward the display unit from a first position at which the at least one data line is connected to at least one of the plurality of source lines to a second position along a direction parallel to the gate lines in the non-display region, the second portion extending into the display unit from the second position of the first portion.

2. The display device of claim 1, wherein in the non-display region, at least two data lines of the plurality of data lines are connected to at least one source line of the plurality of source lines through a demultiplexer (DMUX).

3. The display device of claim 1, wherein the plurality of source lines and the plurality of gate lines are non-orthogonal with respect to each other in the non-display region.

4. The display device of claim 1, wherein the plurality of data lines includes a first data line and a second data line, a length of the first data line in the display unit is longer than a length of the second data line in the display unit, and a length of the first data line in the non-display region is shorter than a length of the second data line in the non-display region.

5. The display device of claim 1, wherein the display unit has at least one of: a circular shape, a triangular shape, a polygonal shape, and an elliptical shape.

6. The display device of claim 1, wherein the display unit has a circular shape, and the non-display region has a ring shape that surrounds the display unit.

7. A display device comprising:
a display unit including a plurality of data lines and a plurality of gate lines, the display unit having a non-rectangular shape;
a gate in panel (GIP) line arranged in a non-display region of the display device, the non-display region having a shape corresponding to the shape of the display unit;
a GIP circuit connected to at least one of the gate ones and to the GIP line, and configured to receive a gate control signal from the GIP line and to apply a gate signal to the at least one of the gate lines based on the received gate control signal; and
a source line arranged in the non-display region, and configured to transmit a data signal to the data lines,
wherein at least one of the data lines extends in a first direction in the display unit and has a bend in the non-display region, the at least one of the data ones extends away from the display unit from the bend to a position at which the at least one data line is connected to the source line in a second direction parallel to at least one of the gate lines in the non-display region.

8. The display device of claim 7, wherein the first direction and the second direction are perpendicular to one another.

9. The display device of claim 7, wherein in the non-display region, at least two data lines of the plurality of data lines are connected to the source line through a demultiplexer (DMUX).

10. The display device of claim 7, wherein the source lines and the plurality of gate lines are non-orthogonal with respect to each other in the non-display region.

11. The display device of claim 7, wherein the plurality of data lines includes a first data line and a second data line, a length of the first data line in the first direction is longer than a length of the second data line in the first direction, and a length of the first data line in the second direction is shorter than a length of the second data line in the second direction.

12. The display device of claim 7, wherein the display unit has at least one of: a circular shape, a triangular shape, a polygonal shape, and an elliptical shape.

13. A display device, comprising:
a display region having a non-rectangular outer periphery;
a non-display region adjacent to the non-rectangular outer periphery of the display region;
a plurality of data lines, each of the data lines including a first portion that extends in a first direction in the display region, and a second portion that extends in a second direction in the non-display region, the second portion extends from the first portion outwardly and away from the display region, the first and second directions being transverse with respect to one another;

a plurality of gate lines that extend in the second direction in the display region and in the non-display region; and a plurality of source lines in the non-display region, each of the source lines having a shape corresponding to the outer periphery of the display region, the second portion of each of the data lines being connected to at least one of the plurality of source lines in the non-display region.

14. The display device of claim 13, further comprising:

a plurality of gate in panel (GIP) circuits in the non-display region, each of the GIP circuits connected to a respective gate line in the non-display region; and a plurality of GIP lines in the non-display region, each of the GIP lines connected to a respective GIP circuit, the GIP lines transmit respective gate control signals to the GIP circuits, and the GIP circuits apply respective gate signals to the gate lines based on the gate control signals.

15. The display device of claim 14, further comprising:

a drive integrated circuit (IC) coupled to the data lines and to the GIP lines, the drive IC supplies data signals to the data lines and supplies the gate control signals to the GIP lines.

16. The display device of claim 13, further comprising:

a demultiplexer (DMUX) positioned in the non-display region and coupled between one of the source lines and at least two of the data lines, the DMUX selectively couples the source line to one of the at least two data lines.

17. The display device of claim 16, wherein a pair of adjacent gate lines are spaced apart from each other by a first gap in a first portion of the non-display region, and are spaced apart from each other by a second gap in a second portion of the non-display region, the first gap being greater than the second gap, the DMUX being positioned between the pair of the gate lines in the first gap.

18. The display device of claim 13, wherein the display unit has at least one of: a circular shape, a triangular shape, a polygonal shape, and an elliptical shape.

19. The display device of claim 13, wherein the display unit has a circular shape, and the non-display region has a ring shape that surrounds the display unit.

20. The display device of claim 13, wherein the first direction and the second direction are perpendicular to each other.

* * * * *

UNITED STATES PATENT AND TRADEMARK OFFICE
CERTIFICATE OF CORRECTION

PATENT NO. : 10,332,440 B2
APPLICATION NO. : 15/804506
DATED : June 25, 2019
INVENTOR(S) : Jongheon Lee et al.

Page 1 of 1

It is certified that error appears in the above-identified patent and that said Letters Patent is hereby corrected as shown below:

In the Claims

Column 12, Line 24, Claim 7:
"a GIP circuit connected to at least one of the gate ones and" should read --a GIP circuit connected to at least one of the gate lines and--.

Column 12, Line 33, Claim 7:
"non-display region, the at least one of the data ones" should read --non-display region, the at least one of the data lines--.

Signed and Sealed this
Twenty-fifth Day of February, 2020

Andrei Iancu
*Director of the United States Patent and Trademark Office*